United States Patent [19]

Roberts et al.

[11] 4,433,316

[45] Feb. 21, 1984

[54] CRYSTAL FILTER AND METHOD FOR FABRICATION

[75] Inventors: Gerald E. Roberts, Lynchburg; Alfred G. Staples, Evergreen, both of Va.

[73] Assignee: General Electric Company, Lynchburg, Va.

[21] Appl. No.: 297,498

[22] Filed: Aug. 28, 1981

[51] Int. Cl.³ .................. H03H 9/205; H03H 9/60
[52] U.S. Cl. ............................. 333/189; 333/192; 29/25.35
[58] Field of Search .................. 333/187–192, 333/193–196; 361/399, 400, 402; 29/25.35, 25.41; 331/107 A, 116, 158, 162; 310/313 R, 340–344, 366

[56] References Cited

U.S. PATENT DOCUMENTS

| | | | |
|---|---|---|---|
| 2,959,752 | 11/1960 | Kosowsky | 333/189 |
| 2,988,714 | 6/1961 | Tehon | 333/189 |
| 3,612,922 | 10/1971 | Furnival | 333/187 X |
| 3,916,490 | 11/1975 | Sheahan et al. | 29/25.35 |
| 3,947,934 | 4/1976 | Olson | 333/175 X |
| 3,947,956 | 4/1976 | Leroux et al. | 361/402 X |
| 3,973,149 | 8/1976 | Vale et al. | 333/150 |
| 4,006,437 | 2/1977 | Simpson et al. | 333/191 |
| 4,013,982 | 3/1977 | Wood et al. | 333/192 |
| 4,028,647 | 6/1977 | Yee | 333/192 |
| 4,045,753 | 8/1977 | Arakawa | 333/191 |
| 4,163,959 | 8/1979 | Dailing | 333/191 |
| 4,342,143 | 8/1982 | Jennings | 361/402 X |

Primary Examiner—Marvin L. Nussbaum
Attorney, Agent, or Firm—Cushman, Darby & Cushman

[57] ABSTRACT

A crystal filter structure and fabrication method therefor. The crystal filter is constructed as a thick film circuit on a ceramic substrate. The coupling capacitors are painted on the ceramic substrate as part of the thick film circuit. The capacitors are laser trimmed to precise tolerance in order to provide a crystal filter having precise characteristics.

10 Claims, 10 Drawing Figures

CRYSTAL FILTER AND METHOD FOR FABRICATION

BACKGROUND OF THE INVENTION

This invention is directed to crystal filters and to crystal filter fabrication techniques.

A basic crystal filter network is shown in U.S. Pat. No. 2,988,714, incorporated herein by reference. To construct such networks, two or more crystals are arranged in a "ladder" network including coupling capacitors coupled to circuit ground so as to form a tuned circuit "transformer" network. Although the basic design of crystal filters has not drastically changed from this crystal "transformer" filter network, operation of such filters at high frequencies and with narrow passbands presents design problems not easily overcome. Most of the developments in the crystal filter art have been directed to the use of different coupling elements between the crystals for tuning them to desired resonance and so as to achieve optimum filter characteristics.

The state of the art in crystal filter fabrication has, up to the present, utilized discrete capacitors, such as "chip" capacitors associated with thick film circuits where necessary for coupling. Usually, the crystal filter is constructed on a printed circuit board with hardwire interconnections among the elements.

Using conventional techniques, it is difficult to mass produce crystal filters while meeting highly precise filter characteristics design criteria. In order to build crystal filters meeting the specifications necessary for current radio applications, it is necessary to utilize very small value coupling capacitors. The capacitance values of these capacitors must be controlled within a narrow tolerance. In order to achieve optimum design using conventional techniques, the fabrication process becomes extremely costly.

SUMMARY OF THE INVENTION

Therefore, the present invention provides a structure and method of fabrication for a thick film crystal filter built on a ceramic substrate. On this ceramic substrate is "painted" a printed capacitor that is easily trimmed to a precise value by a conventional laser trimming process. Using the technique according to the present invention, it becomes much less expensive to fabricate four (4) or six (6) pole crystal filters than it is to do so by conventional manufacturing techniques.

In addition, it is possible to fabricate many crystal filters simultaneously. The fabrication technique according to the present invention includes the following steps:

A master ceramic substrate suitable for producing many crystal filters is provided having first and second sides. The first side thereof is laser scribed to provide convenient lines on which to later break the ceramic substrate into a plurality of smaller substrates. This scribing provides a significant advantage. In fabricating hybrid circuits, it is impossible to print a circuit to the edge of a substrate. When circuits are not printed to the edge of the substrate, it is difficult to solder connect the circuit either to another circuit or element or to a can in which the circuit is to be contained. By pre-scribing and then printing a circuit pattern that overlaps the scribe lines, the substrate can be later broken along the scribe lines and the circuit pattern will be printed to the edge of the substrate at the broken edge. On the second side of the substrate, a copper conductor circuit pattern is printed by a silkscreen process. This copper conductor pattern is then fired. The copper pattern is laid out so as to overlap each of the scribe lines drawn on the first side of the substrate. Thus, when the substrate is later broken, the copper conductor will completely fill the perimeter region of each smaller substrate. After the copper conductor pattern is secured to the ceramic substrate, a dielectric pattern is printed as the next layer, also by a silkscreen process. This dielectric is fired so as to make it permanent. Then, a top conductor layer is silkscreened and fired on top of the dielectric pattern. The first copper conductor pattern, the dielectric, and the top conductor pattern together form one or more thick film capacitors. These capacitors are then laser trimmed. Then the crystals are inserted at the appropriate points. After the crystals are inserted, the substrate is broken along the scribe lines on the first side thereof to produce a plurality of smaller substrates, each having crystals thereon and forming a crystal filter. The assembly including substrate, printed capacitors, and crystals is fitted into a filter can and soldered, with the solder electrically coupling an outer conductor ring about the perimeter of each substrate to the can.

The invention provides a crystal filter structure including at least two crystal elements, a ceramic substrate, and a thick film capacitor on the ceramic substrate for coupling the crystal filter element(s) in network.

BRIEF DESCRIPTION OF THE DRAWINGS

The invention will be better understood by reference to the following detailed description and dependent claims when read in conjunction with the following drawings wherein:

DETAILED DESCRIPTION OF THE PREFERRED EMBODIMENT

Figure 1:
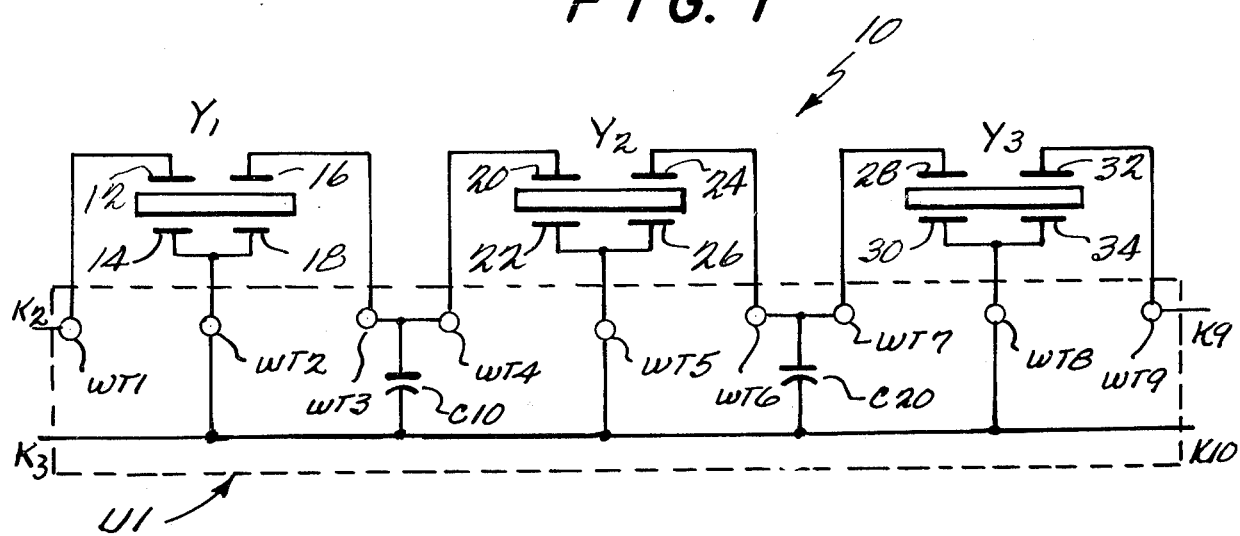
FIG. 1 is a schematic diagram of a 6-pole crystal filter.

Referring now to FIG. 1 there is shown a schematic diagram of a 6-pole crystal filter used in the construction of the present invention and fabricated in accordance with the technique of the present invention. Of course, the structural arrangement and fabrication technique of the present invention are applicable to 4-pole crystal filters and to crystal filters having 8 or more poles. The 6-pole crystal filter is merely one specific example and represents the presently preferred embodiment of the present invention.

STRUCTURE

The 6-pole crystal filter, denoted generally by reference numeral 10, is constructed as a thick film hybrid circuit formed on a ceramic substrate and including three crystals Y1, Y2 and Y3, each of which includes two electrode pairs acoustically coupled via a piezoelectric plate.

Crystal filter 10 is constructed in the form of a "ladder" circuit having inputs K2 and K3 and having outputs K9 and K10. Crystal Y1 includes an input electrode pair formed by electrodes 12 and 14 and output electrode pair formed by electrodes 16 and 18. Crystal Y2 includes an input electrode pair formed by electrodes 20 and 22 and an output electrode pair formed by electrodes 24 and 26. Crystal Y3 includes an input electrode pair formed by electrodes 28 and 30 and an output electrode pair formed by electrodes 32 and 34.

Input K2 is coupled to a terminal WT1 which is electrically coupled to input electrode 12 of crystal Y1. Common electrodes 14 and 18 of crystal Y1 are coupled to a terminal WT2 which is electrically connected with line K3/K10. Output electrodes 16 of crystal Y1 is coupled to a terminal WT3. Input electrode 20 of crystal Y2 is coupled to a terminal WT4. Terminals WT3 and WT4 are electrically connected with one another and coupled to line K3/K10 via a capacitor C10. Common electrodes 22 and 26 of crystal Y2 are coupled to a terminal WT5. Output electrode 24 of crystal Y2 is coupled to a terminal WT6. Input electrode 28 of crystal Y3 is coupled to a terminal WT7. Terminals WT6 and WT7 are electrically coupled to one another and coupled to line K3/K10 via a capacitor C20. Common electrodes 30 and 34 of crystal Y3 are coupled to a terminal WT8 connected to the K3/K10 line. Output terminal 32 of crystal Y3 is coupled to a terminal WT9 which is connected with output K9 of crystal filter 10.

A dotted line U1 surrounding line K3/K10 and the various interconnection terminals represents a copper pattern forming a ground path painted on a ceramic substrate of which line K3/K10 forms a part.

Figure 2:
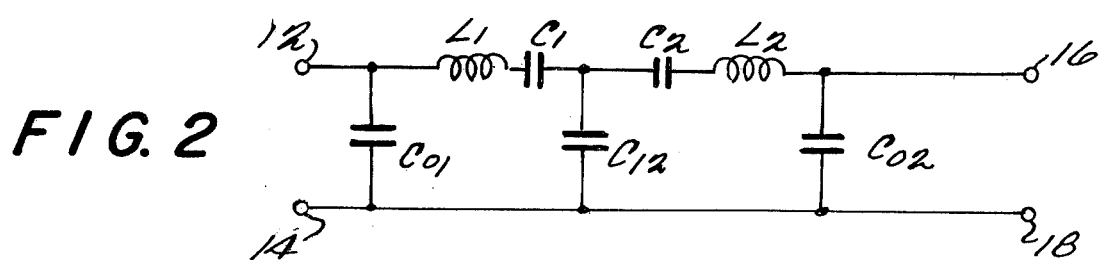
FIG. 2 is a schematic diagram of an equivalent circuit for a crystal such as Y1 shown in FIG. 1.

Referring now to FIG. 2 there is shown a schematic representation of an equivalent circuit for crystal element Y1. Equivalent circuits for crystals Y2 and Y3 are not shown because they are identical to that for crystal Y1, although the actual element values may differ in accordance with the specific filter design. As shown in FIG. 2, each crystal is represented by a ladder network of capacitive and inductive elements forming a tuned circuit.

Figure 3:
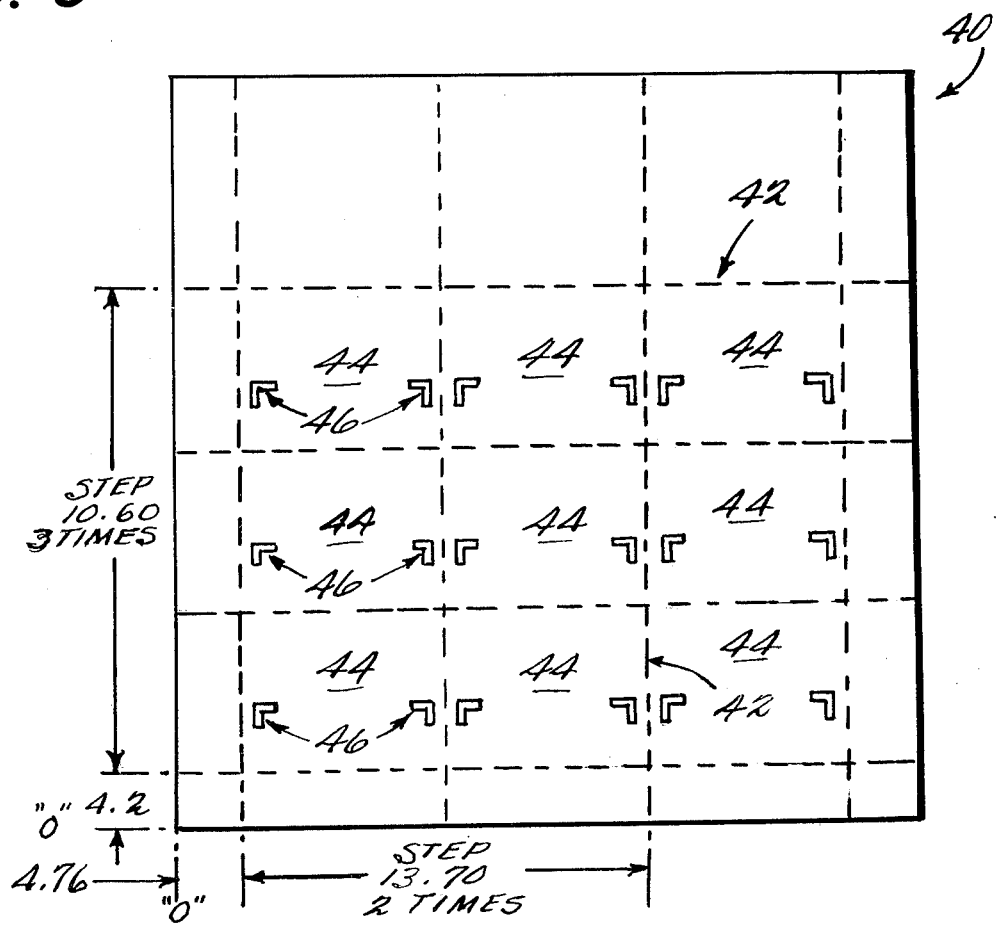
FIG. 3 is a top view of a ceramic substrate used to construct nine crystal filters and showing scribe lines thereon.

Referring now to FIG. 3 there is shown a planar view of a master ceramic substrate 40 used to form nine (9) crystal filters simultaneously. Although the simultaneous fabrication of nine crystal filters is illustrated, such illustration is for convenience only and the invention is not limited thereto. Rather, any number of crystal filters can be fabricated using the techniques set forth herein. The fabrication technique begins by providing a master ceramic substrate 40. This substrate is laser scribed on a first side thereof with scribe lines 42. These scribe lines 42 provide a convenient line along which master substrate 40 can be later broken to produce the nine smaller individual substrates 44 for forming nine separate crystal filters. Each of the nine substrates 44 is shown with an orientation pattern 46 thereon. For each of substrates 44, the conductor pattern runs to the edge of the substrate because the pattern was printed so as to overlap scribe lines 42.

Figure 4:
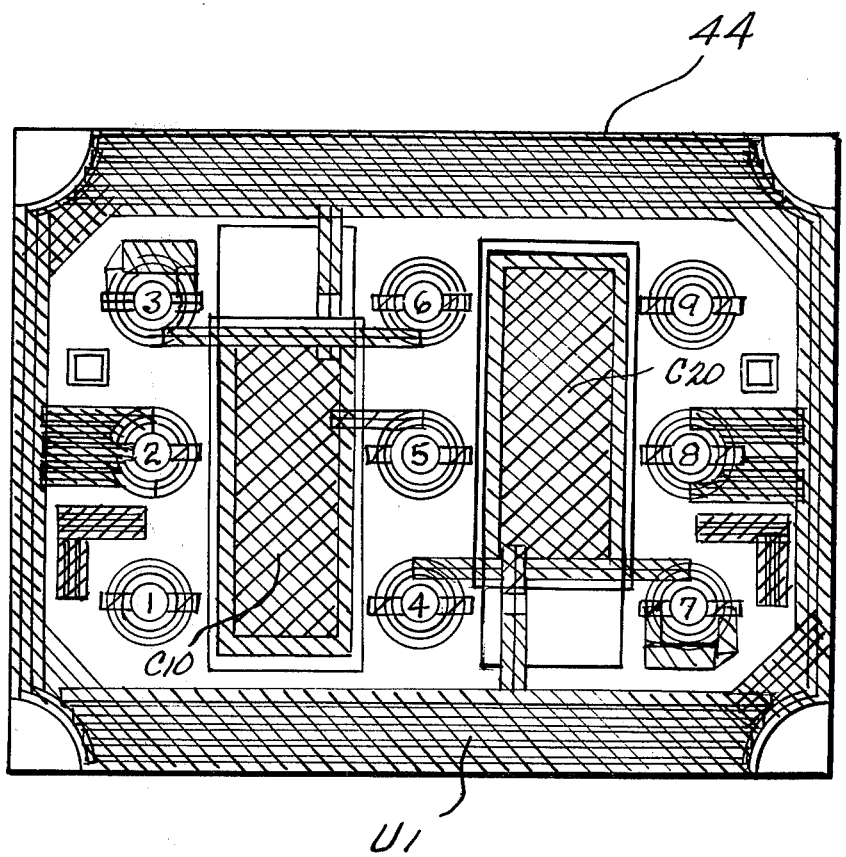
FIG. 4 is a top view of a mask for a single substrate section for one crystal filter showing the positions of the two printed capacitors C1 and C2 and the pinhole locations for the leads of crystal elements Y1, Y2 and Y3.

Referring now to FIG. 4 there is shown a top view of the masking (there are actually four masks) for forming various printed patterns on the second side of the one ceramic substrate 44. However, all nine (9) substrates are identically formed. Holes numbered 1-9 are intended to accommodate the leads from crystals Y1, Y2, and Y3 corresponding to terminals WT1 . . . WT9. After the thick film circuit is formed by silkscreening and firing according to the mask patterns, the leads of crystals Y1, Y2 and Y3 are inserted from the first side of the substrate. FIG. 4 is, in essence, a view of the mask pattern applied to the second or "bottom" side of the ceramic substrate, i.e. leads from the crystals Y1, Y2, and Y3 would be pointing toward the viewer if the crystals were inserted through this pattern.

The first step in forming the conductor pattern and capacitors is the painting of a first conductor pattern via a silkscreen process onto the ceramic substrate. Even though only one substrate 44 is illustrated, the steps relating to the formation of the interconnect pattern and capacitors are carried out on master ceramic substrate 40. Later, the master substrate is broken along the scribe line for fabrication of the individual crystal filters.

The first conductor pattern includes pattern U1 running along the perimeter of each of substrates 44. In essence, U1 is applied to master ceramic substrate 40 so as to overlap the position of the scribe lines on the opposite side of the substrate. Thus, when the scribe lines are later broken, pattern U1 will run to the edge of each of substrates 44. Also, orientation patterns 46 are provided at this time. After the first conductor pattern has been silkscreened, the ceramic substrate 40 is fired to make the conductive pattern permanent.

The next layer silkscreen is a dielectric pattern for forming the dielectric of capacitors C10 and C20. After the dielectric pattern has been screened, the ceramic is again fired to make the dielectric pattern permanent.

After the dielectric has been formed, a top conductor layer is silkscreened and fired. The first conductor layer, dielectric layer and top conductor together form a sandwich defining capacitor C10 and C20. These capacitors, painted on by conductor and dielectric materials are known as thin film capacitors and are formed directly on the ceramic substrate 40.

After the top conductor layer has been applied and made permanent, an encapsulant is applied over the top conductor layer. The encapsulant is applied over only capacitors C10 and C20. It is applied over an area that is only slightly larger than the capacitor plate and/or dielectric area.

In the preferred embodiment, the various layers of the circuit are formed by the following materials. The copper runs are formed by DuPont 9923. The dielectric layers are formed by DuPont 4236. The top conductor is formed by DuPont 9924 and the encapsulant is formed by DuPont 4175. The substrate is a 96% alumina ceramic.

If desired, capacitors C10 and C20 can be laser trimmed according to known techniques immediately after the encapsulant is painted on. However, the capacitors can be laser trimmed after master ceramic substrate is broken along the scribe lines or even after crystals Y1 . . . Y3 have been inserted.

It is preferred that the crystals Y1 . . . Y3 be automatically inserted after the encapsulant layer has been painted over the top conductive layer. After the crystals have been inserted, the leads thereof are soldered to the appropriate conductive pads formed around holes 1 . . . 9 so as to form electrical interconnections with terminals WT1 . . . WT9. After the crystals have been inserted and soldered, ceramic substrate 40 is broken along the scribe lines 42 to form nine thick film crystal filter circuits. After appropriate tests, each filter assembly can be placed in a filter can and soldered to form an electrical connection between the crystal filter can and region U1 forming a ground plane of the crystal filter network. The leads of crystal Y1 are attached at hole 3 to the substrate as shown in FIG. 4, the leads of crystal Y3, attached at hole 7, and the leads of crystal Y2, attached at holes 4, 5, and 5, are clipped.

Figure 5:
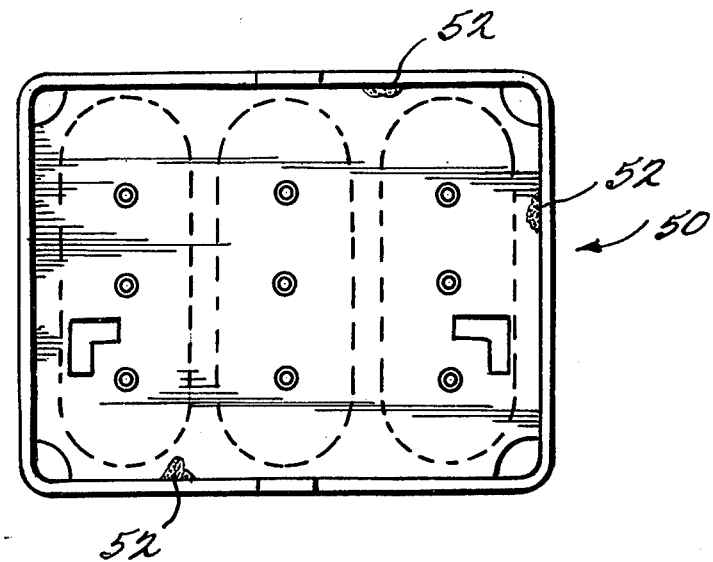
FIG. 5 is a bottom view of a crystal filter according to the present invention after the ceramic substrate has been inserted into a filter can.

Referring now to FIG. 5 there is shown a bottom view of the crystal filter after the ceramic substrate 44 has been inserted into a filter can 50. Solder dots 52 attach the conductor pattern of the substrate to can 50. The dotted lines indicate the outlines of crystals Y1 . . . Y3.

Figure 6:
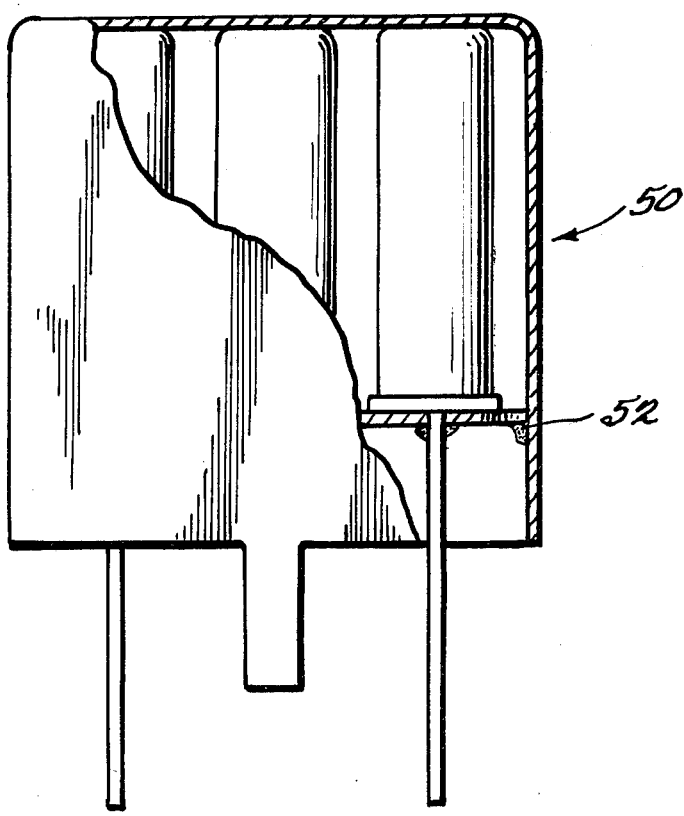
FIG. 6 is a cut-away side view of a completed crystal filter according to the present invention.

Referring now to FIG. 6 there is shown a cutaway side view of a crystal filter according to the present invention. The remaining leads of crystals Y1 and Y3 form convenient input and output leads K2/K3 and K9/K10, respectively.

THE SPECIFIC METHOD STEPS OF FABRICATION

The present invention also provides a method of fabricating a crystal filter of the structure previously described. The method is more specifically set forth with reference to FIGS. 1–6, previously described and with reference to FIGS. 7–10.

The first step in fabricating crystal filters in accordance with the present invention is providing a master ceramic substrate, as shown in FIG. 3. One side of master ceramic substrate 40 is laser scribed with lines 42 on which master substrate will later be broken to form nine individual substrates, each for a single crystal filter. As previously discussed, there is a significant advantage in laser scribing a master substrate 40 in this fabrication method. Using conventional techniques, it is not possible to print a copper pattern to the edge of a hybrid circuit. However, it is desirable to be able to do so. Therefore, a master ceramic substrate 40 is used to fabricate a plurality of individual substrates simultaneously. A copper conductor pattern can be laid down on the opposite side of the ceramic substrate to the side scribed. This copper pattern is arranged to overlap the scribe lines. Thus, when the master substrate 40 is later broken, the copper pattern will run to the edge of each individual substrate 44.

Figure 7:
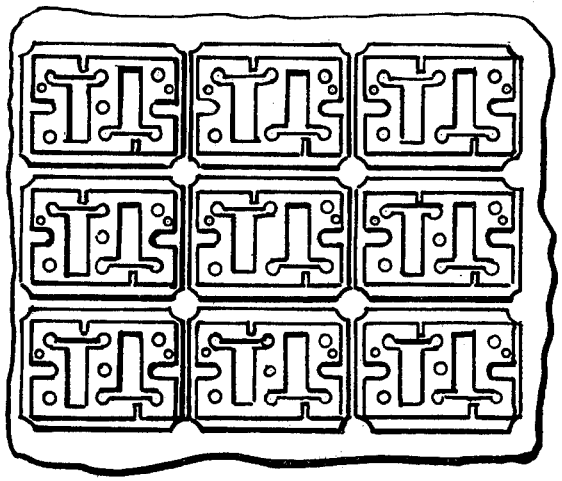
FIG. 7 is a drawing of the negative of a mask used to silkscreen the lower copper conductive pattern on the ceramic substrate.

After master substrate 40 is laser scribed on one side, a first copper conductor pattern is printed onto the other side of the substrate, as shown in FIG. 7. FIG. 7 is a drawing of the negative of a mask used to silkscreen the copper pattern. As shown in the figure, nine identical patterns are screened corresponding to the nine individual ceramic substrates 44 defined by scribe lines 42 in FIG. 3. The two large black areas in each of the patterns shown in FIG. 7 correspond to the lower electrodes of capacitors C10 and C20 (shown schematically in FIG. 1).

Figure 8:
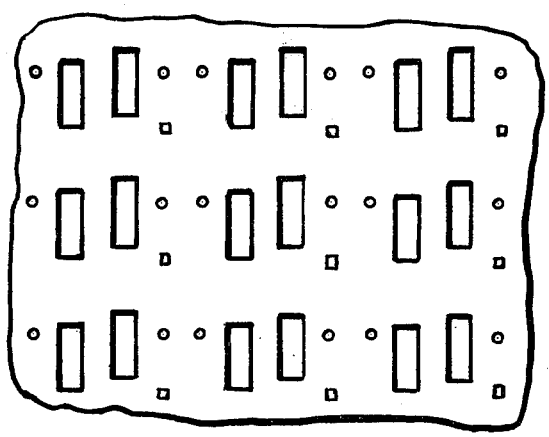
FIG. 8 is a drawing of the negative of a mask used to apply a dielectric layer on top of the lower conductive pattern.

After the first copper pattern has been applied to master substrate 40, a dielectric layer is applied as shown in FIG. 8. FIG. 8 is a drawing of a negative mask used to apply the dielectric material on top of the copper pattern previously applied. The dielectric is applied substantially over the lower electrodes of capacitors C10 and C20 of each crystal filter.

Figure 9:
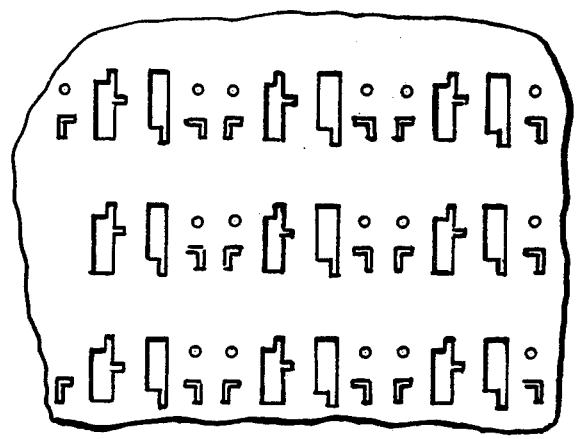
FIG. 9 is a drawing of the negative mask used to silkscreen the upper copper conductive pattern.

After the dielectric has become fixed, the top conductor pattern is applied as shown in FIG. 9. FIG. 9 is a drawing of the negative mask used to screen the upper conductor pattern. This upper conductor pattern includes the upper electrodes for each of capacitors C10 and C20 for each crystal filter. It also includes copper lead lines for interconnection between the crystals and capacitors.

Figure 10:
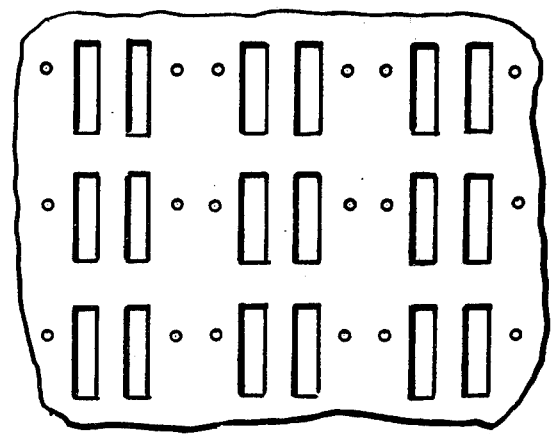
FIG. 10 is a drawing of the negative of a mask used to apply an encapsulant as the final layer of the hybrid circuit.

After the upper conductor pattern has become fixed, an encapsulant is applied as shown in FIG. 10. FIG. 10 is a negative of the mask used to screen the encapsulant over the dielectric layer previously applied.

After the encapsulant has been applied and fixed, capacitors C10 and C20 for each crystal filter are laser trimmed to the exact design value desired. In prior art fabrication techniques, crystal filters were fabricated on printed circuit boards using monoblock or "chip" capacitors. Such capacitors are manufactured in standard values and have a high tolerance or variation (about 5%). Thus, it is difficult to obtain very precise filter characteristics. A significant advantage of the fabrication technique of the present invention is that the capacitors are "painted" onto a ceramic substrate. These capacitors are laser trimmed to the exact value desired so that precise filter characteristics can be obtained. Although it is preferred to laser trim the capacitors immediately after the encapsulant has been fixed, it is possible to laser trim the capacitors in a later step, i.e., after the master substrate 40 has been broken along the scribe lines or after the crystals have been fixed to the substrate.

Assuming that the capacitors have been laser trimmed, master substrate 40 is then broken along scribed lines 42 (see FIG. 3) to form nine individual substrates 44. Of course, even though in this preferred embodiment nine individual substrates are obtained from each master substrate, any number of individual substrates could be manufactured simultaneously within the spirit of the present invention.

After capacitors C10 and C20 for each crystal filter have been laser trimmed, crystals Y1, Y2 and Y3 are inserted in each of the nine crystal filter individual substrates 44. The crystals are inserted by passing their leads through holes 1-9, respectively shown in FIG. 4. After insertion of the 27 crystals (three for each 6-pole crystal filter), the crystal leads are soldered in place. After all leads have been soldered in place, the three leads of crystal Y2 for each filter are clipped. In addition, the leads from each crystal Y1 and Y3 coupled to a capacitor C10 or C20 are also clipped. The remaining leads form inputs and outputs K2/K3 and K9/K10, respectively, of each crystal filter.

After the appropriate leads have been clipped, each individual substrate is inserted into its respective can 50. Solder drops 52 form an electrical connection between circuit ground of each hybrid circuit with its respective can.

While the invention has been described in connection with what is presently considered to be the most practical and preferred embodiment, it is to be understood that the invention is not to be limited to the disclosed embodiment but on the contrary, is intended to cover various modifications and equivalent arrangements included within the spirit and scope of the appended claims, which scope is to be accorded the broadest interpretation so as to encompass all such modifications and equivalent structures.

What is claimed is:

1. A method for fabricating a crystal filter, comprising the steps of:
   providing a master ceramic substrate having first and second sides;
   scribing the first side of the substrate to provide a convenient break point for the later separation of the substrate into a plurality of individual substrates each smaller than the master substrate;
   printing on the second side a first conductor pattern by a silkscreen process the first conductor pattern including at least one capacitor electrode;
   printing over the conductor pattern a dielectric pattern by a silkscreen process;
   printing over the dielectric pattern a second conductor pattern including at least a second capacitor electrode, the first electrode, dielectric pattern, and second electrode forming a printed capacitor and interconnections therefor;
   printing an encapsulant over the second conductor pattern;
   laser trimming the capacitor to obtain a predetermined capacitance value thereof;
   inserting crystals to interconnection terminals formed on the substrate to form the crystal filter; and
   breaking the master substrate along the scribe lines into a plurality of individual substrates for forming respective thick film crystal filter circuits.

2. A method according to claim 1 further including inserting each of the thick film crystal circuits into a can-type enclosure.

3. A method according to claim 1 wherein the step of printing a conductor pattern comprises the step of printing a conductor pattern overlapping the region on the second side of the substrate defined by the scribe lines on the first side of the substrate such that when the substrate is broken along the scribe lines a conductor pattern runs to at least one edge of each of the individual substrates.

4. A method according to claim 1 wherein the step of laser trimming is performed before the substrate is broken along the scribe lines thereon.

5. A method according to claim 1 wherein the step of laser trimming is performed after the substrate is broken along the scribe lines thereon.

6. A crystal filter, comprising:
   a ceramic substrate;
   a thick film circuit formed on said ceramic substrate including at least one capacitor, said thick film circuit comprising a lower electrode formed on the substrate, a dielectric layer formed on the lower electrode and an upper electrode formed on the dielectric layer; and
   two coupled-dual resonator crystals mechanically coupled to the substrate and electrically coupled with the thick film circuit to form the crystal filter.

7. A crystal filter according to claim 6 wherein the crystal filter has a four (4) pole characteristic.

8. A crystal filter according to claim 6 or 7 wherein the crystal filter comprises three (3) crystals and has a six (6) pole characteristic.

9. In a crystal filter comprising in combination at least two crystals and a capacitor in circuit, the improvement consisting essentially of and using in combination with the two crystals and capacitor in circuit, a thick film circuit integrated on a ceramic substrate, wherein the crystals of the crystal filter are mechanically secured to the substrate and electrically interconnected with the thick film circuit.

10. An improvement according to claim 9 wherein the thick film circuit comprises at least one thick film capacitor painted on said ceramic substrate.

* * * * *